US012796353B2

(12) United States Patent
Takeyasu et al.

(10) Patent No.: US 12,796,353 B2
(45) Date of Patent: Nov. 10, 2026

(54) FILM FORMING METHOD AND SUBSTRATE PROCESSING SYSTEM

(71) Applicant: Tokyo Electron Limited, Tokyo (JP)

(72) Inventors: Issei Takeyasu, Nirasaki City (JP); Tadahiro Ishizaka, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 493 days.

(21) Appl. No.: 18/470,878

(22) Filed: Sep. 20, 2023

(65) Prior Publication Data

US 2024/0105445 A1 Mar. 28, 2024

(30) Foreign Application Priority Data

Sep. 28, 2022 (JP) ................................ 2022-155501
Mar. 8, 2023 (JP) ................................ 2023-035971

(51) Int. Cl.

| | |
|---|---|
| ***H10P 14/60*** | (2026.01) |
| ***C23C 16/06*** | (2006.01) |
| ***C23C 16/40*** | (2006.01) |
| ***C23C 16/52*** | (2006.01) |
| ***H10P 72/00*** | (2026.01) |
| ***H10P 72/78*** | (2026.01) |

(52) U.S. Cl.

CPC .......... *H10P 14/6334* (2026.01); *C23C 16/06* (2013.01); *C23C 16/405* (2013.01); *C23C 16/52* (2013.01); *H10P 72/0454* (2026.01); *H10P 72/78* (2026.01)

(58) Field of Classification Search

CPC .. H10P 14/6334; H10P 72/78; H10P 72/0454; C23C 16/06; C23C 16/405; C23C 16/52
USPC .......................................................... 118/728
See application file for complete search history.

(56) References Cited

U.S. PATENT DOCUMENTS

| | | | | |
|---|---|---|---|---|
| 2019/0214230 | A1* | 7/2019 | Cui | H01J 37/32091 |
| 2020/0098627 | A1* | 3/2020 | Ishizaka | H10P 72/7612 |
| 2021/0010135 | A1* | 1/2021 | Ishizaka | C23C 16/45536 |
| 2022/0301882 | A1* | 9/2022 | Takatsuki | H10P 50/285 |
| 2024/0355615 | A1* | 10/2024 | Ishizaka | H10P 70/27 |
| 2024/0363405 | A1* | 10/2024 | Sakamoto | H10W 20/0523 |

FOREIGN PATENT DOCUMENTS

| | | | |
|---|---|---|---|
| JP | H06314722 | A | 11/1994 |
| JP | 2020059916 | A | 4/2020 |
| JP | 2021014613 | A | 2/2021 |
| KR | 10-2020-0033742 | A | 3/2022 |

* cited by examiner

*Primary Examiner* — Charlee J. C. Bennett
(74) *Attorney, Agent, or Firm* — Armstrong Teasdale LLP

(57) ABSTRACT

A film forming method includes: preparing, on a stage, a substrate having an insulating layer in which a recess defined by an upper portion, a side wall portion, and a bottom portion is formed, and a tungsten layer exposed from the bottom portion of the recess; removing a tungsten oxide film, which has been formed by oxidizing the tungsten layer at the bottom portion, by supplying $TiCl_4$ gas to at least the bottom portion of the recess; and embedding a ruthenium film in the recess after removing the tungsten oxide film.

16 Claims, 9 Drawing Sheets

110
120
101
100

TiCl$_4$
110
120
101
100

TiCl$_4$, H$_2$
NH$_3$, Ar
110
120
102
101
100

O$_2$
110
120
102
103
100

Cl$_2$, Ar
110
120
103
100

Raw material gas, CO
110
120
100

110
130
120
100

110
120
101
100

$TiCl_4$
110
120
101
100

$TiCl_4$, $H_2$
$NH_3$, Ar
110
120
103
(102)
101
100

$O_2$
110
120
103
101
100

$Cl_2$, Ar
110
120
103
100

Raw material gas, CO
110
120
100

130
110
120
100

$Cl_2$, Ar
110
120
103
101
100
Repeat

FILM FORMING METHOD AND SUBSTRATE PROCESSING SYSTEM

CROSS-REFERENCE TO RELATED APPLICATIONS

This application is based upon and claims the benefit of priority from Japanese Patent Application Nos. 2022-155501 and 2023-035971, filed on Sep. 28, 2022, and Mar. 8, 2023, respectively, the entire contents of which are incorporated herein by reference.

TECHNICAL FIELD

The present disclosure relates to a film forming method and a substrate processing system.

BACKGROUND

For example, when embedding a ruthenium film in a recess formed in an insulating layer, in Patent Documents 1 and 2, if a natural oxide film is formed on the surface of a tungsten layer exposed from the recess, it is proposed to remove the natural oxide film and then to fill the recess with the ruthenium film.

For example, in Patent Document 3, it is proposed to form a Ti—Si layer on the top surface of a Borophosphosilicate glass (BPSG) layer formed on a silicon substrate surface, to laminate a TiN—Ti-based barrier metal layer on the Ti—Si layer, and to form an electrode wire on the barrier metal layer. It is described that the Ti film of the barrier metal layer, which adheres to the BPSG layer, absorbs O of $SiO_2$, which is the main portion of the BPSG layer, thereby being turned into $TiO_2$.

PRIOR ART DOCUMENTS

Patent Documents

Patent Document 1: Japanese Laid-Open Patent Publication No. 2021-14613
Patent Document 2: Japanese Laid-Open Patent Publication No. 2020-59916
Patent Document 3: Japanese Laid-Open Patent Publication No. H06-314722

SUMMARY

According to one embodiment of the present disclosure, there is provided a film forming method including: preparing, on a stage, a substrate having an insulating layer in which a recess defined by an upper portion, a side wall portion, and a bottom portion is formed, and a tungsten layer exposed from the bottom portion of the recess; removing a tungsten oxide film, which has been formed by oxidizing the tungsten layer at the bottom portion, by supplying $TiCl_4$ gas to at least the bottom portion of the recess; and embedding a ruthenium film in the recess after removing the tungsten oxide film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
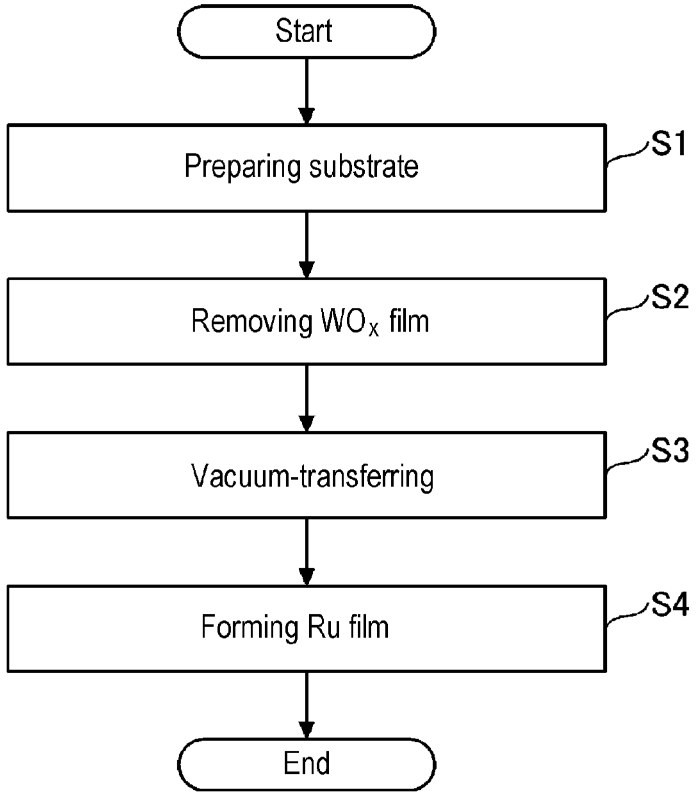
FIG. 1 is a flowchart illustrating an example of a film forming method according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In each of the drawings, the same components may be denoted by the same reference numerals, and redundant descriptions thereof may be omitted.

In a film structure in which a tungsten layer is exposed at the bottom of a recess formed in an insulating layer such as a silicon nitride film (SiN) or silicon oxide film ($SiO_2$), there is a process of embedding a ruthenium film in the recess.

Since the ruthenium film embedded in the recess functions as a metal wire, the material of the bottom of the recess to be in contact with the ruthenium film is preferably a material having as low a resistance as possible. On the other hand, the tungsten layer used as the material for the bottom of the recess is a material that is easily oxidized, and the surface of the tungsten layer is easily oxidized and is turned into a tungsten oxide film ($WO_x$). When the ruthenium film is formed on the tungsten oxide film, since the tungsten oxide film is an insulator, the resistance becomes high at the contact portion with the ruthenium film. Therefore, it is preferable to remove the tungsten oxide film at the bottom of the recess and to use a low-resistance tungsten layer as the material for the bottom of the recess. Therefore, first and second embodiments provide a film forming method that is capable of effectively removing a tungsten oxide film before embedding a ruthenium film in a recess.

First Embodiment

[Film Forming Method]

A film forming method according to the first embodiment will be described with reference to FIGS. 1 and 2A to 2D. FIG. 1 is a flowchart illustrating an example of the film forming method according to the first embodiment. FIGS. 2A to 2D are cross-sectional views illustrating film structures for explaining the film forming method of FIG. 1.

(Step S1)

Figures 2A, 2B, 2C, 2D:
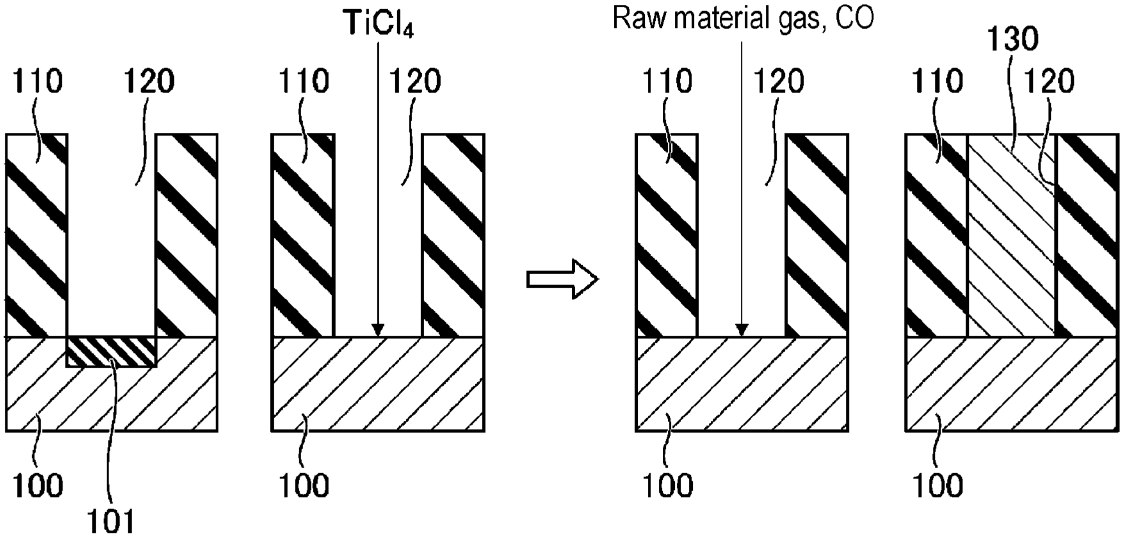
FIGS. 2A to 2D are cross-sectional views illustrating film structures for explaining the film forming method of FIG. 1.

In the film forming method according to the first embodiment illustrated in FIG. 1, in step S1, a substrate is prepared by carrying the substrate into a processing chamber (referred to as a "first processing chamber"), which will be described later, and placing the substrate on a stage in a first processing chamber. As illustrated in FIG. 2A, the substrate has an insulating layer 110 in which a recess 120 defined by an upper portion, a side wall portion, and a bottom portion is formed, and a tungsten layer 100, which is an underlying layer of the insulating layer 110 and is exposed from the bottom portion of the recess 120. The insulating layer 110 is either a silicon oxide film, a silicon nitride film, or a layer obtained by forming a silicon oxide film on a silicon nitride film. The recesses 120 may be a trench, a via hole, a contact hole, or the like. FIG. 2A illustrates a state in which the surface of the tungsten layer 100 exposed at the bottom portion of the recess 120 is naturally oxidized and a tungsten oxide film 101 is formed while the substrate is being placed on the stage or being transferred.

(Step S2)

Next, in step S2, $TiCl_4$ gas is supplied into the first processing chamber. Then, the tungsten oxide film 101 is removed by the $TiCl_4$ gas supplied to at least the bottom portion of the recess 120 in the substrate. As a result, the tungsten oxide film 101 exposed at the bottom portion of the recess 120 is removed, as illustrated in FIG. 2B.

An example of process conditions for step S2 is provided.

<Removal of $WO_x$ by $TiCl_4$ Gas: Process Conditions>

Temperature (temperature of substrate (wafer)): 300 degrees C. to 600 degrees C.

Pressure: 1 Torr to 20 Torr (133.3 Pa to 2,666 Pa)

Gas: $TiCl_4$, Ar

Flow rate of $TiCl_4$: 10 sccm to 300 sccm

Flow rate of Ar: 300 sccm to 3,000 sccm

Plasma: Absent

Typical conditions may include 460 degrees C., 9 Torr (1,200 Pa), and $TiCl_4$/Ar of 90/1,000 sccm. However, the present disclosure is not limited thereto.

(Step S3)

Next, in step S3, the substrate from which the tungsten oxide film 101 has been removed is prepared by vacuum-transferring the substrate from the first processing chamber to a processing chamber (referred to as a "second processing chamber") configured to embed a ruthenium film and placing the substrate on the stage within the second processing chamber. As will be described later, the first processing chamber and the second processing chamber are connected to a vacuum transfer chamber so that the substrate can be transferred between the first processing chamber and the second processing chamber without breaking the vacuum by a transfer device within the vacuum transfer chamber.

(Step S4)

Next, in step S4, a ruthenium-containing raw material gas and CO gas are supplied to embed ruthenium (Ru) in the recess 120, and the processing is terminated. The ruthenium-containing raw material gas is simultaneously supplied with the CO gas as a carrier gas. As a result, as illustrated in FIG. 2C, the ruthenium-containing raw material gas is supplied to the recess 120 by using the CO gas as a carrier gas, and a ruthenium film 130 is formed in the recess 120.

An example of process conditions for step S4 is provided.

<Film Formation of Ru Layer: Process Conditions>

Temperature (temperature of substrate (wafer)): 100 degrees C. to 300 degrees C.

Pressure: 5 mTorr to 200 mTorr (0.666 Pa to 26.666 Pa)

Gas: Ruthenium-containing raw-material gas, CO gas

Flow rate of CO: 100 sccm to 2,000 sccm

Plasma: Absent

Typical conditions may include 156 degrees C., 20 mTorr (2.666 Pa), and CO of 350 sccm. However, the present disclosure is not limited thereto.

The ruthenium-containing raw material gas is any of a gas containing $Ru_3(CO)_{12}$, (2,4-dimethylpentadienyl)(ethylcyclopentadienyl)ruthenium: (Ru(DMPD)(EtCp)), bis(2,4-dimethylpentadienyl)Ruthenium: $(Ru(DMPD)_2)$, 4-dimethylpentadienyl)(methylcyclopentadienyl)Ruthenium: (Ru (DMPD)(MeCp)), Bis(Cyclopentadienyl)Ruthenium: $(Ru(C_5H_5)_2)$, Cis-dicarbonylbis(5-methylhexane-2,4-dionate) ruthenium(II), bis(ethylcyclopentadienyl)Ruthenium(II): $Ru(EtCp)_2$, or the like may be used.

As a result, the ruthenium film 130 is formed in a bottom-up manner from the bottom portion of the recess 120, as illustrated in FIG. 2D. In this manner, a film of ruthenium is formed while suppressing the generation of voids or seams, and the ruthenium film 130 that fills the entire recess 120 is formed.

In a ruthenium embedding method of the related arts, the tungsten oxide film 101 at the bottom portion of the recess 120 may remain due to reoxidation or the like, and a ruthenium film 130 may be formed on the tungsten oxide film 101. Therefore, the tungsten oxide film, which is an insulator, increases the resistance at the contact portion of the ruthenium film 130 (a wiring layer).

In contrast, the film forming method according to the first embodiment includes: a process of preparing, on the stage of the first processing chamber, a substrate having an insulating layer 110 in which a recess 120 defined by an upper portion, a side wall portion, and a bottom portion is formed, and a tungsten layer 100 exposed from the bottom portion of the recess 120; a process of supplying $TiCl_4$ gas to at least the bottom portion of the recess 120 to remove a tungsten oxide film 101 formed due to oxidation of the tungsten layer 100 from the bottom portion of the recess 120; and a process of embedding a ruthenium film 130 in the recess 120 after removing the tungsten oxide film 101.

With the film forming method according to the first embodiment, the ruthenium film 130 is formed on the tungsten layer 100 at the bottom portion of the recess 120 after effectively removing the tungsten oxide film 101 with $TiCl_4$ gas. As a result, metal wiring by the ruthenium film 130 having low resistance to the tungsten layer 100 becomes possible.

The temperature condition for removing the tungsten oxide film 101 with $TiCl_4$ gas in the first processing chamber (step S2) is 300 degrees C. to 600 degrees C. On the other hand, the temperature condition during the formation of the ruthenium film 130 in the second processing chamber (step S4) is 100 degrees C. to 300 degrees C. Therefore, since the temperature zones to be controlled in step S2 and step S4 are different from each other, the first processing chamber and the second processing chamber may be implemented as separate processing chambers.

Second Embodiment

[Film Forming Method]

Figure 3:
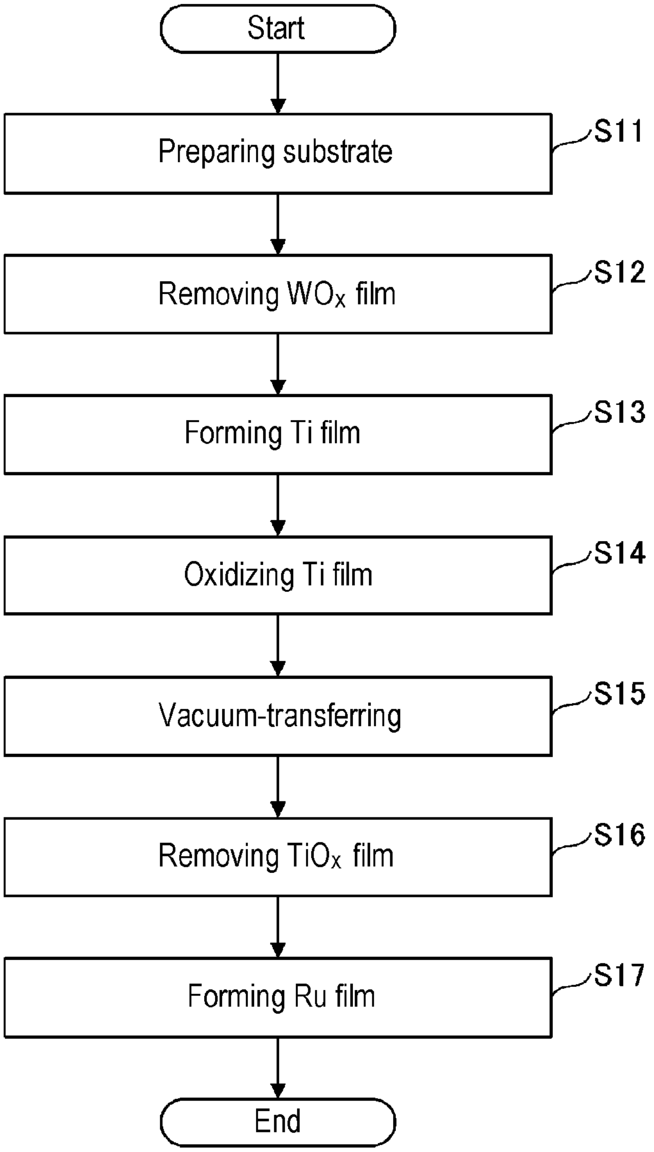
FIG. 3 is a flowchart illustrating an example of a film forming method according to a second embodiment.

Next, a film forming method according to the second embodiment will be described with reference to FIGS. 3 and 4A to 4G. FIG. 3 is a flowchart illustrating an example of the film forming method according to the second embodiment. FIGS. 4A to 4G are cross-sectional views illustrating film structures for explaining the film forming method of FIG. 3.

(Step S11)

Figures 4A, 4B, 4C, 4D, 4E, 4F, 4G:
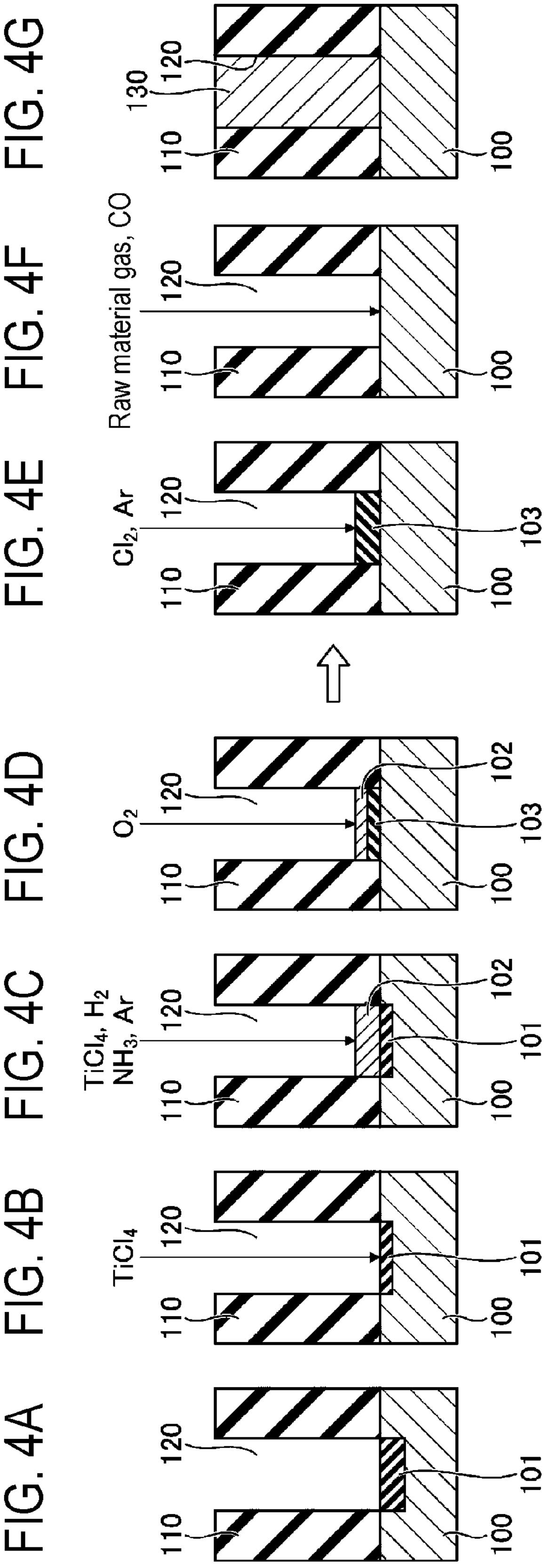
FIGS. 4A to 4G are cross-sectional views illustrating film structures for explaining the film forming method of FIG. 3.

In the film forming method according to the second embodiment illustrated in FIG. 3, in step S11, a substrate is prepared by carrying the substrate into the first processing chamber and placing the substrate on the stage in the first processing chamber. As illustrated in FIG. 4A, the substrate has an insulating layer 110 in which a recess 120 defined by an upper portion, a side wall portion, and a bottom portion is formed, and a tungsten layer 100, which is exposed from the bottom portion of the recess 120. FIG. 4A illustrates a state in which the surface of the tungsten layer 100 exposed at the bottom portion of the recess 120 is naturally oxidized and a tungsten oxide film 101 is formed.

(Step S12)

Next, in step S12, $TiCl_4$ gas is supplied into the first processing chamber. Then, the tungsten oxide film 101 is removed by the $TiCl_4$ gas supplied to at least the bottom portion of the recess 120 in the substrate. As a result, the tungsten oxide film 101 exposed at the bottom portion of the recess 120 is removed. Since the process conditions of step S12 are the same as the process conditions of step S2 in FIG. 1, a description thereof is omitted here.

However, a case where the tungsten oxide film 101 cannot be completely removed or a case where the tungsten layer 100 is re-oxidized may occur. For example, even if the tungsten oxide film 101 were removable by supplying $TiCl_4$ gas, there is a case where the tungsten layer 100 exposed from the bottom portion of the recess 120 is re-oxidized during the transfer from the first processing chamber to the second processing chamber and a tungsten oxide film 101 is formed.

In addition, in step S12, due to the use of $TiCl_4$ gas, there is a case where titanium and/or titanium oxide is generated as a reaction by-product and remains as a residue on the surfaces of the tungsten oxide film 101 and the tungsten layer 100 exposed from the bottom portion of the recess 120. The reaction by-product of titanium and/or the titanium oxide remaining as the residue causes an increase in resistance at the contact portion between the ruthenium film 130 and the tungsten layer 100. Due to these multiple factors, the tungsten oxide film 101 may remain on the surface layer of the bottom portion of the recess 120, as illustrated in FIG. 4B.

(Step S13)

Therefore, in the film forming method according to the second embodiment, the titanium film 102 is formed on the remaining tungsten oxide film 101 in the next step S13.

An example of process conditions for step S13 is provided.

<Film Formation of Ti Film: Process Conditions>

Temperature (temperature of substrate (wafer)): 300 degrees C. to 600 degrees C.
Pressure: 1 Torr to 20 Torr
Gas: $TiCl_4$, $H_2$, $NH_3$, Ar
Flow rate of $TiCl_4$: 10 sccm to 200 sccm
Flow rate of $H_2$: 10 sccm to 200 sccm
Flow rate of $NH_3$: 300 sccm to 3,000 sccm
Flow rate of Ar: 300 sccm to 3,000 sccm
RF power: 100 W to 1,000 W
Plasma: Present Typical conditions may include 460 degrees C., 5 Torr (666.6 Pa), $TiCl_4/H_2/NH_3$/Ar of 25/20/900/1,200 sccm, and RF power of 300 W. However, the present disclosure is not limited thereto.

As a result, a titanium film 102 is formed on the exposed tungsten oxide film 101 by plasma of gases of $TiCl_4$, $H_2$, $NH_3$ and Ar, as illustrated in FIG. 4C. As a result, the bottom portion of the recess 120 is capped with the titanium film 102 so that formation of the tungsten oxide film 101 by further oxidation of the tungsten layer 100 can be suppressed at the bottom portion.

In addition, since the titanium film 102 adheres to the tungsten oxide film 101 (FIG. 4C), Ti of the titanium film 102 absorbs O (oxygen) of the tungsten oxide ($WO_x$) film 101 and is turned into and stabilized as $TiO_x$. As a result, as illustrated in FIG. 4D, the tungsten oxide film 101 is removed without residue, and a portion of the titanium film 102 on the contact side with the tungsten layer 100 (lower side) is modified into a titanium oxide ($TiO_x$) film 103.

(Step S14)

Next, in step S14, the remaining titanium film 102 is modified into a titanium oxide film 103. The modification of the titanium film 102 into the titanium oxide film 103 effectively prevents the tungsten layer 100 from being re-oxidized during the transfer of the substrate to the second processing chamber for forming a ruthenium film.

An example of process conditions for step S14 is represented.

<Oxidation of Ti Film: Process Conditions>

Temperature (temperature of substrate (wafer)): 300 degrees C. to 600 degrees C.
Pressure: 1 Torr to 20 Torr
Gas: $O_2$
Flow rate of $O_2$: 300 sccm to 3,000 sccm However, the gas is not limited to 02 gas, and may be $O_3$ gas, and RF power may be supplied to generate oxygen (O) plasma. That is, plasma may be either of being present or absent.

Typical conditions may include 460 degrees C., 5 Torr (666.6 Pa), and $O_2$ of 1,000 sccm. However, the present disclosure is not limited thereto.

In addition, there is a possibility that in step S13, Ti absorbs O from the tungsten oxide ($WO_x$) film 101, so that all of the titanium film 102 will be modified into the titanium oxide film 103. In addition, there is also a possibility that all of the titanium film 102 is modified into the titanium oxide film 103 during transfer from the first processing chamber to the second processing chamber. In that case, it may be considered to omit the processing of step S14.

However, there may also be a case where not all of the titanium film 102 is necessarily modified into the titanium oxide film 103. In some cases, the titanium oxide film 103 and the titanium film 102 may be alternately laminated in three or more stages. In this case, only the uppermost titanium oxide film 103 is removed in the step of removing the titanium oxide film 103 (S16), which will be described later, and the titanium oxide film 103 existing under the titanium film 102 cannot be removed. Therefore, in order to remove all of the titanium oxide film 103 on the tungsten layer 100 in the step of removing the titanium oxide film 103, which will be described later, and then embed a ruthenium film, it is preferable to execute the oxidation of the titanium film 102 in step S14. As a result, all of the titanium film 102 can be modified into the titanium oxide film 103.

(Step S15)

In step S15, the substrate in the state in which the titanium film 102 in FIG. 4D is completely oxidized and is turned into the titanium oxide film 103 in step S14 is prepared by vacuum-transferring the substrate from the first processing chamber into the second processing chamber and placing the substrate on the stage within the second processing chamber. As will be described below, the transfer of the substrate from the first processing chamber to the second processing chamber can be done without breaking the vacuum. FIG. 4D illustrates the state of the substrate when the substrate is placed on the stage within the second processing chamber. The substrate having the titanium oxide film 103 formed on the tungsten layer 100 at the bottom portion of the recess 120 is prepared.

(Step S16)

Next, in step S16, the titanium oxide film 103 is removed by supplying $Cl_2$ gas to at least the bottom portion of the recess 120 in the second processing chamber.

<Removal of $TiO_x$ Layer: Process Conditions>

Temperature (temperature of substrate (wafer)): 100 degrees C. to 500 degrees C.

Pressure: 0.1 Torr to 5 Torr (13.33 Pa to 666.6 Pa)

Gas: $Cl_2$, Ar

Flow rate of $Cl_2$: 5 sccm to 300 sccm

Flow rate of Ar: 100 sccm to 3,000 sccm

Plasma: Present

Typical conditions may include 156 degrees C., 500 mTorr (66.66 Pa), and $Cl_2$/Ar of 6/400 sccm. However, the present disclosure is not limited thereto.

In step S16, a chemical reaction represented by chemical reaction formula (1) is caused by plasma of $Cl_2$ gas.

$$TiO(s)+Cl_2(g) \rightarrow TiOCl_2(g) \quad (1)$$

As a result, the titanium oxide film 103 reacts with chlorine is turned into $TiOCl_2$ gas, which is volatilized, and the titanium oxide film 103 is removed as illustrated in FIG. 4F.

In the above, the titanium oxide film is removed by generating plasma from $Cl_2$, but the same effect may be obtained by supplying $Cl_2$ gas without generating plasma.

(Step S17)

Next, in step S17, a ruthenium-containing raw material gas and a CO gas are supplied to the bottom portion of the recess 120 from which the titanium oxide film 103 has been removed, to embed ruthenium (Ru) in the recess 120, and the processing is terminated. A raw material gas for embedding ruthenium is simultaneously supplied with CO gas as a carrier gas. As a result, as illustrated in FIG. 4G, the raw material gas is supplied to the recess 120 by using the CO gas as a carrier gas, and a ruthenium film 130 is formed in the recess 120.

Since the process conditions and the types of ruthenium-containing raw material gases in step S17 are the same as the process conditions and the exemplified types of ruthenium-containing material gases in step S4 of FIG. 1, a description thereof is omitted here.

The film forming method according to the second embodiment is a film forming method for embedding a ruthenium film 130 in a recess 120. The film method includes: a process of preparing a substrate having an insulating layer 110 having a recess 120 defined by an upper portion, a side wall portion, and a bottom portion, and a tungsten layer 100 exposed from the bottom portion of the recess 120 on a stage; and a process of forming a titanium film 102 on the tungsten layer 100 exposed from the bottom portion of the recess 120 before embedding the ruthenium film 130 in the recess 120. The titanium film 102 suppresses oxidation of the tungsten layer 100 exposed from the bottom portion of the recess 120.

This causes the titanium film 102 to act as an oxidation suppressing layer for the tungsten layer 100, and the substrate can be vacuum-transferred from the first processing chamber to the second processing chamber in the state in which the tungsten layer 100 is capped with the titanium film 102. As a result, the substrate can be transferred to the second processing chamber without forming a tungsten oxide film 101.

According to the film forming method of the second embodiment, after the substrate is transferred to the second processing chamber, the titanium oxide film 103 is removed and then the ruthenium film 130 is formed on the tungsten layer 100 at the bottom portion of the recess 120. As a result, the ruthenium film 130 can be formed on the tungsten layer 100 at the bottom portion of the recess 120 without any titanium oxide or titanium residue. Therefore, metal wiring by the ruthenium film 130 having low resistance to the tungsten layer 100 becomes possible.

The temperature conditions during the removal of the tungsten oxide film 101 by $TiCl_4$ gas in the first processing chamber (step S12), during the formation of the titanium film 102 (step S13), and during the oxidation of the titanium film 102 (step S14) are 300 degrees C. to 600 degrees C. On the other hand, the temperature conditions during the removal of the titanium oxide film 103 (step S16) and during the formation of the ruthenium film 130 (step S17) in the second processing chamber are 100 degrees C. to 500 degrees C. and 100 degrees C. to 300 degrees C., respectively. Therefore, since the temperature zones to be controlled in steps S12 to S14, step S16, and step S17 are different from each other, the first processing chamber and the second processing chamber may be implemented as separate processing chambers.

Third Embodiment

[Film Forming Method]

Figure 5:
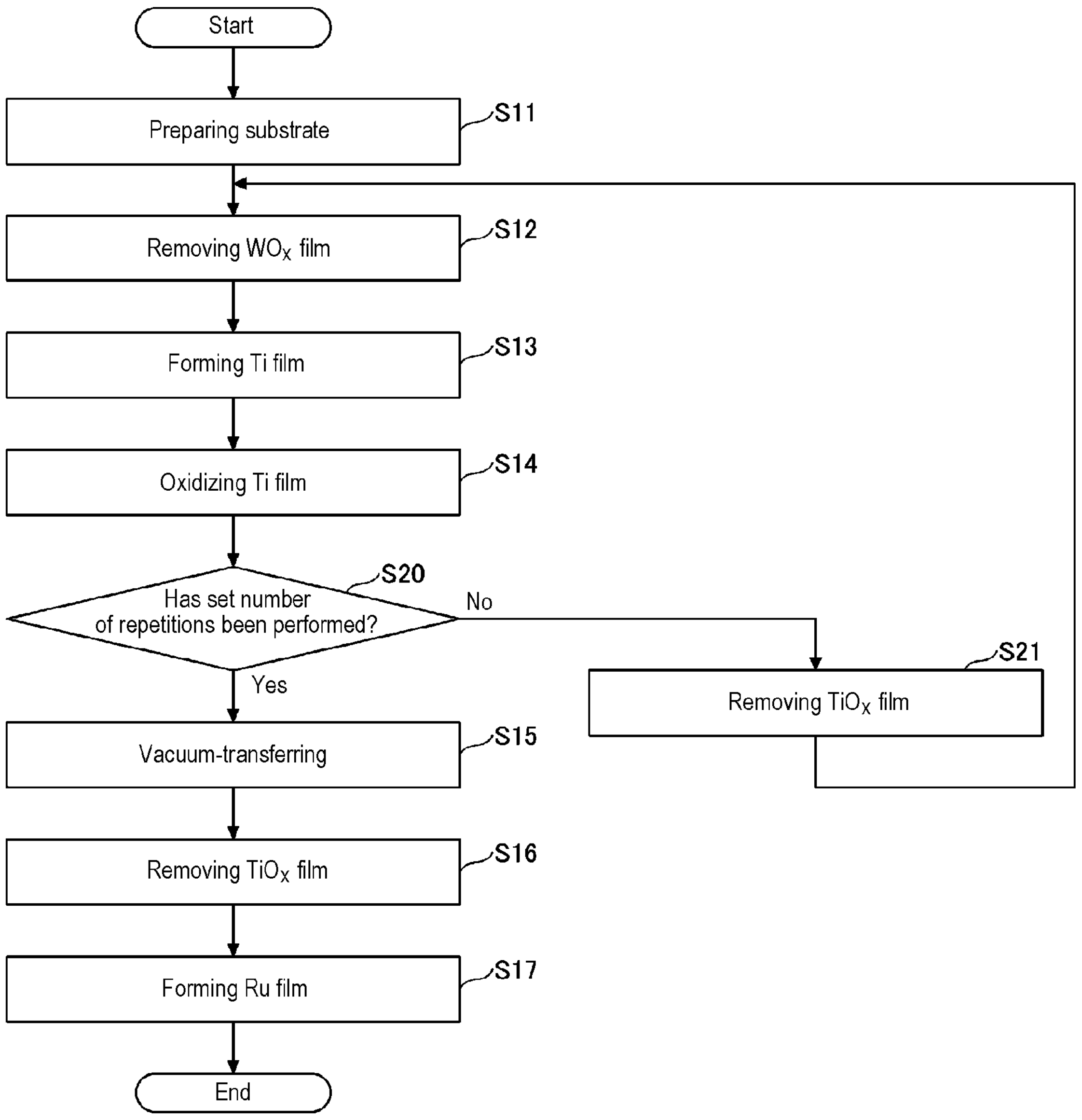
FIG. 5 is a flowchart illustrating an example of a film forming method according to a third embodiment.

Next, a film forming method according to a third embodiment will be described with reference to FIGS. 5 and 6A to 6H. FIG. 5 is a flowchart showing an example of the film forming method according to the third embodiment. FIGS. 6A to 6H are cross-sectional views illustrating a film structure for explaining the film forming method of FIGS. 6A to 6H.

In the film forming method of the third embodiment illustrated in FIG. 5, the same step numbers are given to the same processing steps as in the film forming method of the second embodiment illustrated in FIG. 3, and a description of processing indicated by the same step number is omitted or simplified. Similarly, FIGS. 6A to 6G correspond to FIGS. 4A to 4G, respectively.

In the film forming method according to the second embodiment illustrated in FIG. 3, the titanium (Ti) film 102 is formed on the tungsten oxide film 101 in step S13. The formed titanium film 102 adheres to the tungsten oxide film 101 (FIG. 4C), whereby the Ti of the titanium film 102 absorbs O (oxygen) from the tungsten oxide film 101 and is turned into and stabilized as titanium oxide ($TiO_x$). That is, at the interface between the titanium (Ti) film 102 formed in step S13 and the tungsten oxide ($WO_x$) film 101, a reaction to extract O, from $WO_x$ ($Ti+WO_x \rightarrow TiO_x+W$) occurs. As a result, the $WO_x$ is reduced and removed, and a titanium oxide ($TiO_x$) film 103 is formed.

However, the tungsten oxide ($WO_x$) film 101 may not be completely reduced by performing steps S12 to S14 only once. In this case, as illustrated in FIG. 6D, when the titanium oxide ($TiO_2$) film 103 is present on the tungsten oxide film 101, reduction of the tungsten oxide film 101 does not proceed.

Therefore, in the film forming method according to the third embodiment, when the tungsten oxide film 101 is not completely reduced after steps S12 to S14 are performed, the step of reducing $WO_x$ and the step of removing $TiO_2$ are repeated to completely remove the tungsten oxide film 101. Specifically, in step S20 of FIG. 5, it is determined whether steps S12 to S14 have been repeated a set number of times. The set number of times is set in advance to the state in which the tungsten oxide film 101 is not present under the titanium oxide film 103 in step S14, that is, the number of times the tungsten oxide film 101 can be completely reduced.

Figures 6A, 6B, 6C, 6D, 6E, 6F, 6G, 6H:
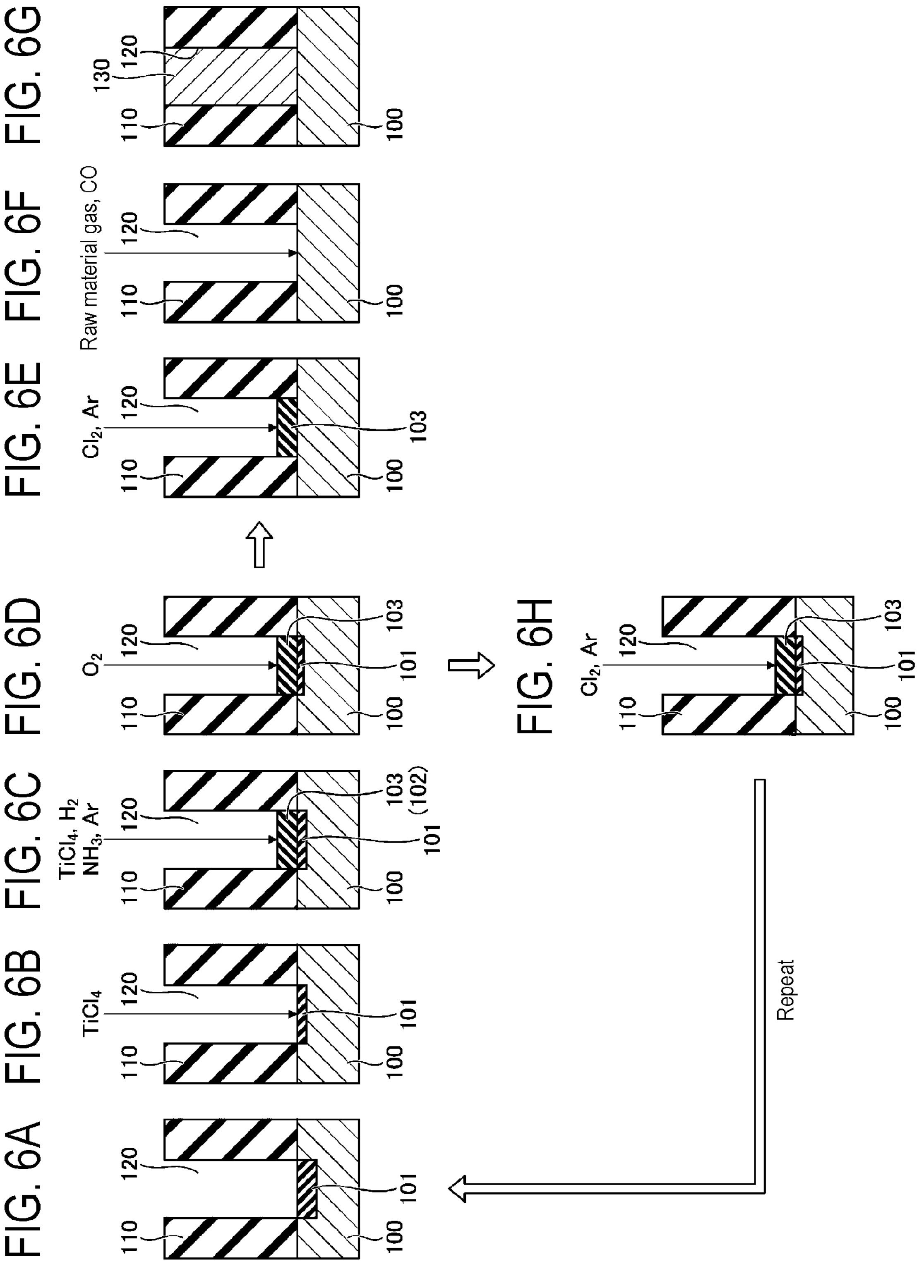
FIGS. 6A to 6H are cross-sectional views illustrating film structures for explaining the film forming method of FIG. 5.

When it is determined in step S20 that the set number of repetitions has not been performed, the process proceeds to step S21, in which $Cl_2$ gas and Ar gas are supplied to at least the bottom portion of the recess 120 in the first processing chamber to remove the titanium oxide film 103 (see FIG. 6H and FIG. 6A). The process conditions in the removal of the $TiO_x$ layer in step S21 are basically the same as the process conditions at the time of performing the removal of the titanium oxide film 103 in step S16. However, step S16 is the processing performed in the second processing chamber, and the temperature of the substrate is controlled to 100 degrees C. to 500 degrees C. On the other hand, step S21 is the processing performed in the first processing chamber, and considering the temperature zone of 300 degrees C. to 600 degrees C. used in the processing of steps S12 and S14 performed in the first processing chamber, the temperature of the substrate is preferably controlled to an overlapping temperature zone of 300 degrees C. to 500 degrees C. After executing the processing of step S21, the process returns to step S12, and the processing of steps S12 to S14 is repeated.

When it is determined in step S20 that the set number of repetitions has been performed, the process proceeds to step S15 and the substrate is vacuum-transferred to the second processing chamber. The processing of steps S16 and S17 executed in the second processing chamber is the same as the processing of the same-numbered steps in film formation according to the second embodiment, and therefore the description thereof is omitted here.

In the film forming method according to the third embodiment, the processing of steps S12 to S14 is repeated a preset number of times (FIGS. 6A to 6D). After executing the processing of step S14 (FIG. 6D) and before executing the processing of step S12 (FIG. 6A), the processing of step S21 is executed to remove the titanium oxide film 103 (FIG. 6H). As a result, the tungsten oxide film 101 can be completely reduced. Therefore, metal wiring by the ruthenium film 130 having low resistance to the tungsten layer 100 becomes possible.

In the film forming methods according to the second and third embodiments, the gas used for forming a Ti film in the processing of step S13 was a mixed gas of $TiCl_4$, $H_2$, $NH_3$, and Ar (FIG. 4C and FIG. 6C). However, $H_2$ gas may not be supplied but it is more preferable to supply $H_2$ gas and to use plasma generated from the $H_2$ gas.

In addition, in the film forming methods according to the second and third embodiments, $O_2$ gas is used to oxidize the Ti film in the processing of step S14 (FIG. 6A). However, $O_2$ gas may not be supplied but it is more preferable to supply $O_2$ gas.

[Substrate Processing System]

Figure 7:
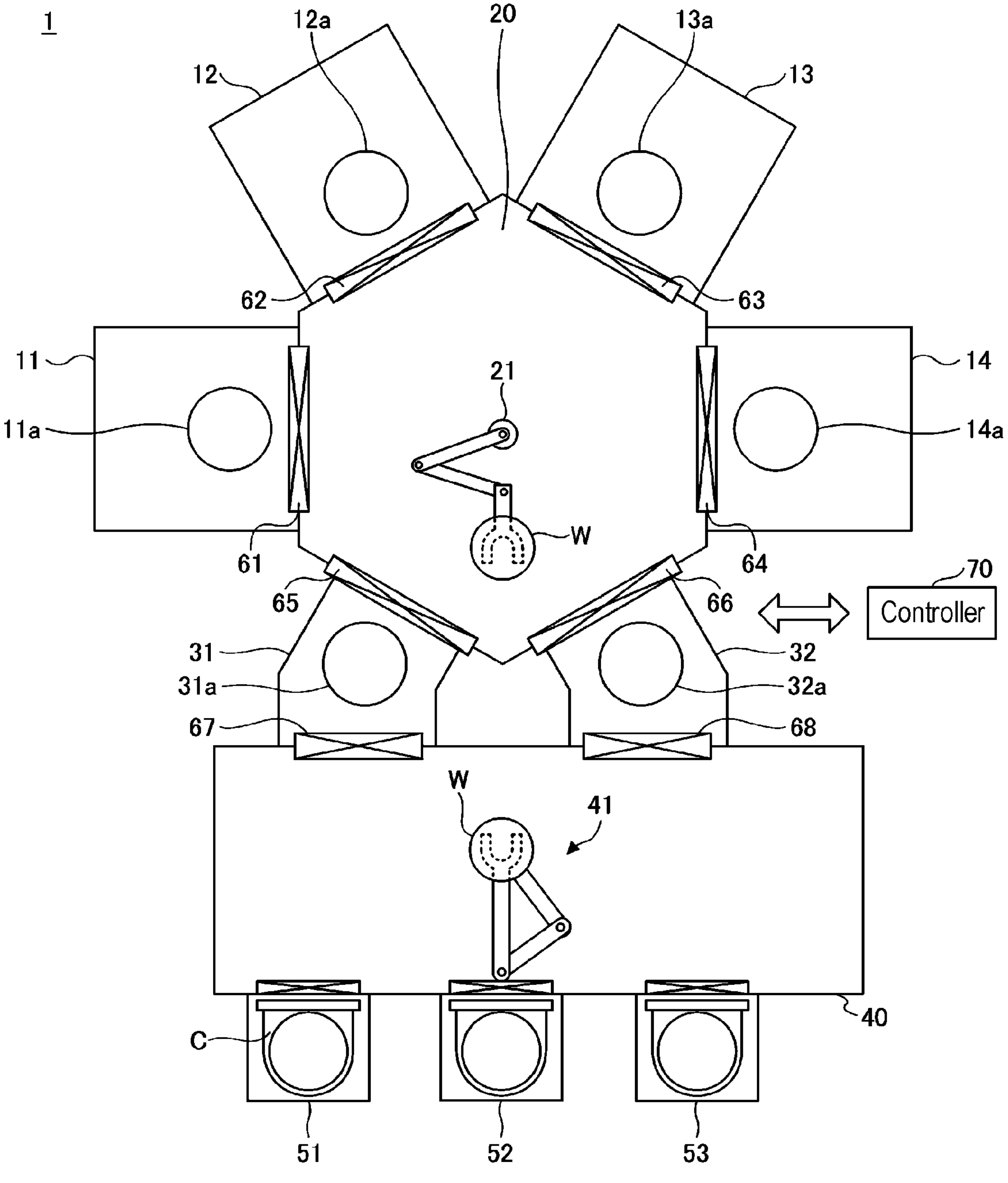
FIG. 7 is a view illustrating a configuration example of a substrate processing system according to an embodiment.

A configuration example of a substrate processing system including two or more processing chambers will be described below with reference to FIG. 7. FIG. 7 is a view illustrating a configuration example of a substrate processing system according to an embodiment.

The substrate processing system 1 includes a plurality of processing chambers 11 to 14, a vacuum transfer chamber 20 connected to the plurality of processing chambers 11 to 14 and configured to vacuum-transfer a substrate W to the plurality of processing chambers 11 to 14, and a controller 70.

Although the example of the substrate processing system 1 illustrated in FIG. 7 includes four processing chambers 11 to 14, the substrate processing system 1 may have eight processing chambers. For example, by providing four processing chambers on each of opposite surfaces of the rectangular vacuum transfer chamber 20, a substrate processing system 1 having eight processing chambers can be constructed. However, the present disclosure is not limited thereto, and the substrate processing system 1 may have two or more processing chambers.

The substrate processing system 1 further includes load-lock chambers 31 and 32, an atmospheric transfer chamber 40, load ports 51 to 53, gate valves 61 to 68, and a controller 70. The processing chamber 11 includes a stage 11*a* on which a substrate (hereinafter, referred to as "substrate W") (e.g., a semiconductor wafer) is placed, and is connected to the vacuum transfer chamber 20 through the gate valve 61. Similarly, the processing chamber 12 includes a stage 12*a* on which a substrate W is placed, and is connected to the vacuum transfer chamber 20 through the gate valve 62. The processing chamber 13 includes a stage 13*a* on which a substrate W is placed, and is connected to the vacuum transfer chamber 20 through the gate valve 63. The processing chamber 14 includes a stage 14*a* on which a substrate W is placed, and is connected to the vacuum transfer chamber 20 through the gate valve 64. The interior of each of the processing chambers 11 to 14 is depressurized to a predetermined vacuum (depressurized) atmosphere, and a desired processing (e.g., etching, film formation, cleaning, or ashing) is performed on a substrate W in the interior. The operations of respective parts for executing the processes in the processing chambers 11 to 14 are controlled by the controller 70.

The interior of the vacuum transfer chamber 20 is depressurized to a predetermined vacuum (depressurized) atmosphere. In addition, a transfer mechanism 21 is provided in the vacuum transfer chamber 20. The transfer mechanism 21 transfers substrates W to the processing chambers 11 to 14 and the load-lock chambers 31 and 32. The operation of the transfer mechanism 21 is controlled by the controller 70.

The load-lock chamber 31 includes a stage 31*a* on which a substrate W is placed, and is connected to the vacuum transfer chamber 20 through the gate valve 65 and to the atmospheric transfer chamber 40 through the gate valve 67. Similarly, the load-lock chamber 32 includes a stage 32*a* on which a substrate W is placed, and is connected to the vacuum transfer chamber 20 through the gate valve 66 and to the atmospheric transfer chamber 40 through the gate valve 68. The interior of each of the load-lock chambers 31 and 32 is configured to be switchable between an air atmosphere and a vacuum (depressurized) atmosphere. In addition, the switching between the vacuum (depressurized) atmosphere and the air atmosphere in the load-lock chambers 31 and 32 is controlled by the controller 70.

The interior of the atmospheric transfer chamber 40 is the air atmosphere, and, for example, a downflow of clean air is formed in the atmospheric transfer chamber 40. In addition, the atmospheric transfer chamber 40 is provided with a transfer mechanism 41. The transfer mechanism 41 transfers substrates W to the load-lock chambers 31 and 32 and carriers C in the load ports 51 to 53. The operation of the transfer mechanism 41 is controlled by the controller 70.

The load ports 51 to 53 are provided in the wall of a long side of the atmospheric transfer chamber 40. A carrier C, in which substrates W are accommodated, or an empty carrier C is mounted in each of the load ports 51 to 53. The carrier C is, for example, a front opening unified pod (FOUP).

The gate valves 61 to 68 are configured to be openable/closable. In addition, the opening/closing of the gate valves 61 to 68 are controlled by the controller 70.

The controller 70 controls the entire substrate processing system 1 by performing, for example, the operations of the processing chambers 11 to 14, the operations of the transfer mechanisms 21 and 41, the opening/closing of the gate valves 61 to 68, and the switching between the vacuum (depressurized) atmosphere and the air atmosphere in the load-lock chambers 31 and 32.

Next, examples of operations of the substrate processing system will be described. For example, the controller 70 opens the gate valve 67 and controls the transfer mechanism 41 to transfer, for example, a substrate W accommodated in the carrier C in the load port 51 to the stage 31*a* of the load-lock chamber 31. The controller 70 closes the gate valve 67 and creates a vacuum (depressurized) atmosphere in the load-lock chamber 31.

The controller 70 opens the gate valves 61 and 65, and controls the transfer mechanism 21 to transfer the substrate W in the load-lock chamber 31 to the stage 11*a* of the processing chamber 11. The controller 70 closes the gate valves 61 and 65 and operates the processing chamber 11. As a result, the processing chamber 11 executes a predetermined processing (e.g., processing executed in the first processing chamber) on the substrate W.

Subsequently, the controller 70 opens the gate valves 61 and 62, and controls the transfer mechanism 21 to transfer the substrate W processed in the processing chamber 11 to the stage 12*a* of the processing chamber 12. The controller 70 closes the gate valves 61 and 62 and operates the processing chamber 12. As a result, the processing chamber 12 executes predetermined processing (processing executed in the second processing chamber) on the substrate W.

The controller 70 may transfer the substrate W processed in the processing chamber 11 to the stage 13*a* or 14*a* of the processing chamber 13 or 14 capable of performing the same processing as in the processing chamber 12. The ruthenium film forming process performed in the second processing chamber takes more time than other processes. Accordingly, in an embodiment, the substrate W processed in the processing chamber 11 is transferred to one of the processing chambers 12, 13, and 14 depending on the operating states of the processing chambers 12, 13, and 14. As a result, the controller 70 may perform the ruthenium film forming process on a plurality of substrates W in parallel by using the processing chambers 12, 13, and 14. As a result, productivity can be improved.

The controller 70 controls the transfer mechanism 21 to transfer the substrates W processed in the processing chambers 12 to 14 to the stage 31*a* of the load-lock chamber 31 or the stage 32*a* of the load-lock chamber 32. The controller 70 creates an air atmosphere in the load-lock chamber 31 or the load-lock chamber 32. The controller 70 opens the gate valve 67 or the gate valve 68, and controls the transfer mechanism 41 to transfer the substrate W in the load-lock chamber 32 to, for example, the carrier C in the load port 53 so that the substrate W is accommodated in the carrier C.

As described above, with the substrate-processing system 1 illustrated in FIG. 7, while a substrate W is being processed by each processing chamber, predetermined processing can be performed on the substrate W without exposing the substrate W to the air, that is, without breaking the vacuum.

[Processing Apparatus]

Figure 8:
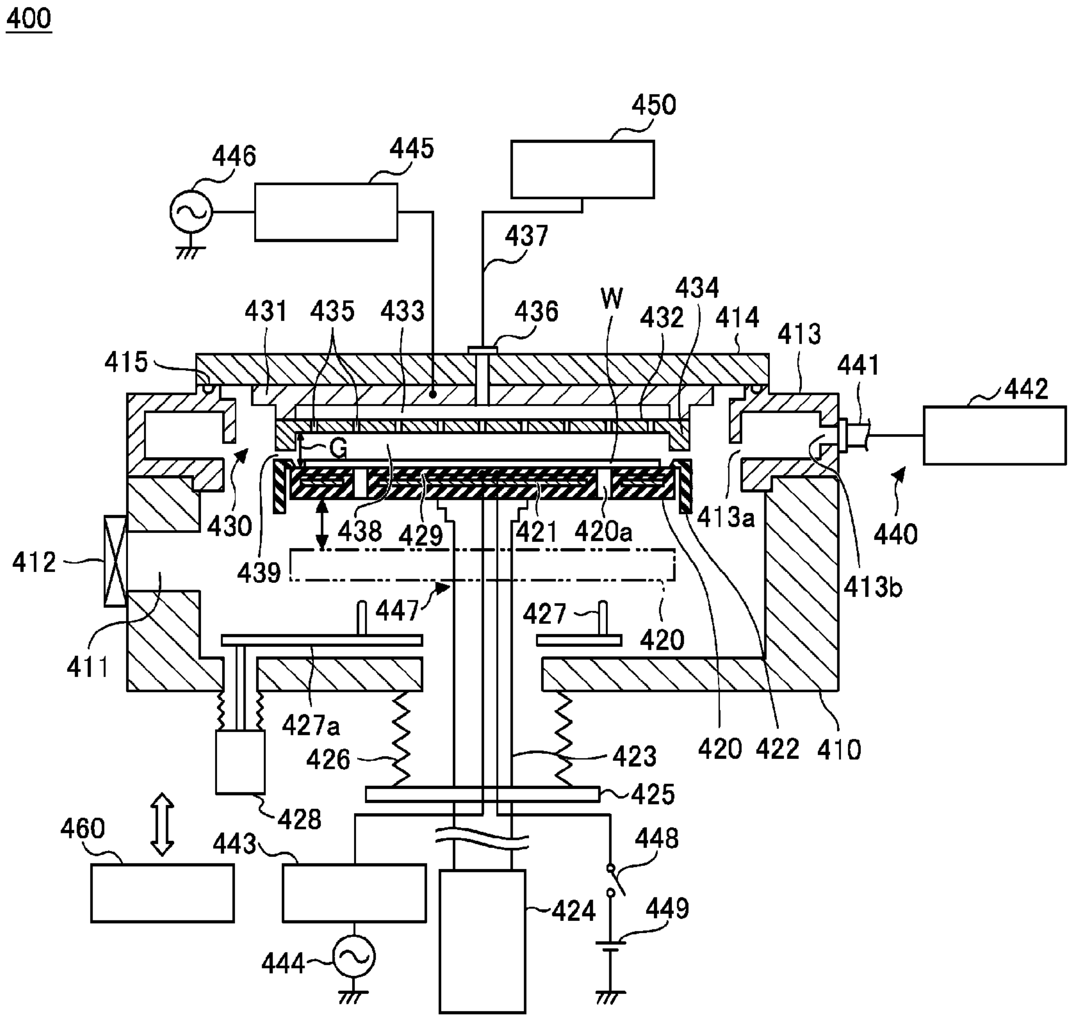
FIG. 8 is a configuration example of a processing apparatus that implements a first processing chamber according to an embodiment.

A configuration example of the processing apparatus 400 that implements the first processing chamber in a film forming method of an embodiment will be described. FIG. 8 is a schematic cross-sectional view illustrating a processing apparatus as a configuration example of the processing apparatus that implements the first processing chamber according to an embodiment.

The processing apparatus 400 illustrated in FIG. 8 is an apparatus that performs, for example, processes of removing a tungsten oxide film 101 by using $TiCl_4$ gas (steps S2 and S12). In addition, the processing apparatus 400 is an apparatus that performs the process of forming a titanium film 102 (step S13). In addition, the processing apparatus 400 is an apparatus that performs the process of oxidizing the titanium film 102 (step S14). Furthermore, the processing apparatus 400 is an apparatus that performs the process of the titanium oxide film 103 (step S21) in the film forming method according to the third embodiment.

The processing apparatus 400 includes a processing container 410, a stage (placement table) 420, a shower head 430, an exhauster 440, a gas supplier 450, and a controller 460.

The processing container 410 is made of a metal such as aluminum, and has a substantially cylindrical shape. A carry-in/out port 411 is formed in the side wall of the processing container 410 for carry-in or carry-out of a substrate W. The carry-in/out port 411 is opened/closed by a gate valve 412. An annular exhaust duct 413 having a rectangular cross section is provided on the main body of the processing container 410. A slit 413*a* is formed along the inner peripheral surface of the exhaust duct 413. An exhaust port 413*b* is formed in the outer wall of the exhaust duct 413. On the top surface of the exhaust duct 413, a ceiling wall 414 is provided to close the upper opening in the processing container 410. The space between the exhaust duct 413 and the ceiling wall 414 is hermetically sealed with a seal ring 415.

The stage 420 is a member that horizontally supports a substrate W within the processing container 410, and is illustrated as a stage 11*a* in FIG. 7. The stage 420 is formed in a disk shape having a size corresponding to the substrate W, and is supported by a support member 423. The stage 420 is formed of a ceramic material such as aluminum nitride (AlN) or a metal material such as aluminum or nickel alloy, and a heater 421 and an electrode 429 are embedded in the stage 2 to heat the substrate W. The heater 421 generates heat by being fed with power from a heater power supply (not illustrated). In addition, the output of the heater 421 is controlled by a temperature signal of a thermocouple (not illustrated) provided in the vicinity of the top surface of the stage 420, whereby the temperature of the substrate W is controlled to a predetermined temperature.

A first radio-frequency power supply 444 is connected to the electrode 429 via a matcher 443. The matcher 443 matches the internal impedance of the first radio-frequency power supply 444 with a load impedance. The first radio-frequency power supply 444 applies power of a predetermined frequency to the stage 420 via the electrode 429. For example, the first radio-frequency power supply 444 applies radio-frequency power of 13.56 MHz to the stage 420 via the electrode 429. The radio-frequency power is not limited to 13.56 MHz, and, for example, 450 KHz, 2 MHz, 27 MHz, 60 MHz, 100 MHz, or the like may be appropriately used. In this way, the stage 420 also functions as a lower electrode.

The electrode 429 is connected to a power supply 449 via an ON/OFF switch 448 disposed outside the processing container 410, and also functions as an electrode that attracts a substrate W to the stage 420.

In addition, a second radio-frequency power supply 446 is connected to the shower head 430 via a matcher 445. The matcher 445 matches the internal impedance of the second radio-frequency power supply 446 with a load impedance. The second radio-frequency power supply 446 applies power of a predetermined frequency to the shower head 430. For example, the second radio-frequency power supply 446 applies radio-frequency power of 13.56 MHz to the shower head 430. The radio-frequency power is not limited to 13.56 MHz, and, for example, 450 KHz, 2 MHz, 27 MHz, 60 MHz, 100 MHz, or the like may be appropriately used. In this way, the shower head 430 also functions as an upper electrode.

The stage 420 is provided with a cover member 422 made of ceramic, such as alumina, to cover the outer peripheral region of the top surface and the side surface thereof. An adjustment mechanism 447 configured to adjust a gap G between the upper electrode and the lower electrode is provided on the bottom surface of the stage 420. The adjustment mechanism 447 includes a support member 423 and a lifting mechanism 424. The support member 423 supports the stage 420 from the center of the bottom surface of the stage 420. In addition, the support member 423 penetrates a hole formed in the bottom wall of the processing container 410 and extends to the lower side of the processing container 410, and the lower end thereof is connected to the lifting mechanism 424. The stage 420 is raised/lowered via the support member 423 by the lifting mechanism 424. The adjustment mechanism 447 raises/lowers the lifting mechanism 424 between a processing position, which is indicated by the solid line in FIG. 8, and a delivery position, which is indicated by the chain double-dashed line below the processing position and allows a substrate W to be transferred, thereby enabling carry-in and carry-out of the substrate W.

A flange 425 is provided on the support member 423 below the processing container 410, and a bellows 426, which partitions the atmosphere in the processing container 410 from the outside air, is provided between the bottom surface of the processing container 410 and the flange 425 to expand/contract in response to the raised/lowered movement of the stage 420.

Three lifting pins 427 (of which only two are illustrated) are provided in the vicinity of the bottom surface of the processing container 410 to protrude upward from a lifting plate 427*a*. The lifting pins 427 are raised and lowered via the lifting plate 427*a* by a lifting mechanism 428 provided below the processing container 410.

The lifting pins 427 are inserted through through-holes 420*a* provided in the stage 420 located at the delivery position and are configured to protrude and retract with respect to the top surface of the stage 420. The substrate W is delivered between the transfer mechanism (not illustrated) and the stage 420 by raising/lowering the lifting pins 427.

The shower head 430 supplies a processing gas into the processing container 410 in a shower form. The shower head 430 is made of a metal, is provided to face the stage 420, and has a diameter that is substantially the same as that of the stage 420. The shower head 430 includes a main body 431 fixed to the ceiling wall 414 of the processing container 410 and a shower plate 432 connected below the main body 431. A gas diffusion space 433 is formed between the main body 431 and the shower plate 432. In the gas diffusion space 433, a gas introduction hole 436 is provided through the centers of the main body 431 and the ceiling wall 414 of the processing container 410. An annular protrusion 434 protruding downward is formed on the peripheral edge of the shower plate 432. Gas ejection holes 435 are formed in the flat surface inside the annular protrusion 434. In the state in which the stage 420 is present at the processing position, the processing space 438 is formed between the stage 420 and the shower plate 432, and the top surface of the cover member 422 and the annular protrusion 434 are close to each other to form an annular gap 439 therebetween.

The exhauster 440 exhausts the interior of the processing container 410. The exhauster 440 includes an exhaust pipe 441 connected to the exhaust port 413*b*, and an exhaust mechanism 442 connected to the exhaust pipe 441 and including a vacuum pump, a pressure control valve, or the like. During the processing, the gas in the processing container 410 reaches the exhaust duct 413 via the slit 413*a*, and is exhausted from the exhaust duct 413 through the exhaust pipe 441 by the exhaust mechanism 442.

A gas supplier 450 is connected to the gas introduction hole 436 of the shower head 430 via a gas supply line 437. The gas supplier 450 supplies various gases used in the process of removing the tungsten oxide film 101 (steps S2 and S12), the process of forming the titanium film 102 (step S13), and the process of oxidizing the titanium film 102 (step S14). Various gases used in the process of removing the titanium oxide film 103 (step S21) may be supplied.

The gas supply line 437 is appropriately branched to correspond to each of the processes described above, and is provided with an opening/closing valve and a flow rate controller. The gas suppler 450 is configured to control the flow rates of various gases by controlling the opening/closing valve and the flow rate controller provided in each gas supply line.

The operation of the processing apparatus 400 configured as described above is comprehensively controlled by the controller 460. The controller 460 is, for example, a computer, and includes a central processing unit (CPU), a random access memory (RAM), a read only memory (ROM), an auxiliary memory, and the like. The CPU operates on the basis of a program stored in the ROM or the auxiliary storage device or a process condition, and controls the overall operation of the apparatus. For example, the controller 460 controls the operation of supplying various gases from the gas supplier 450, the raising/lowering operation of the lifting mechanism 424, the operation of exhausting the interior of the processing container 410 by the exhaust mechanism 442, and the power supplied from the first radio-frequency power supply 444 and the second radio-frequency power supply 446. A computer-readable program necessary for control by the controller 460 may be stored in a storage medium. The storage medium includes, for example, a flexible disk, a compact disk (CD), a CD-ROM, a hard disk, a flash memory, a DVD, or the like. In addition, the controller 460 may be provided independently of the controller 70 (see FIG. 7), or the controller 70 may also serve as the controller 460.

An example of the operation of the substrate processing apparatus 400 will be described. At the start, the interior of the processing chamber 11 is in a vacuum (depressurized) atmosphere by the exhauster 440. In addition, the stage 420 is moved to the delivery position.

The controller 460 opens the gate valve 412. Here, a substrate W is placed on the lifting pins 427 by the external transfer mechanism 21 (see FIG. 7). When the transfer mechanism 21 comes out of the carry-in/out port 411, the controller 460 closes the gate valve 412.

The controller 460 controls the lifting mechanism 424 to move the stage 420 to the processing position. At this time, as the stage 420 is raised, the substrate W placed on the lifting pins 427 is placed on the placement surface of the stage 420.

At the processing position, the controller 460 operates the heater 421 to turn on the ON/OFF switch 448 to cause the substrate W to be attracted to the stage 420. In addition, the controller 460 also controls the gas supplier 450 to supply the gas for each process from the shower head 430 into the processing chamber 11. Thereby, the process of removing the tungsten oxide film 101 with $TiCl_4$ gas (steps S2 and S12) is performed. In addition, the processing apparatus 400 performs the process of forming the titanium film 102 (step S13). The processing apparatus 400 also performs the process of oxidizing the titanium film 102 (step S14). In addition, the processing apparatus 400 performs the process of removing the titanium oxide film 103 (step S21). The gas after processing passes through a flow path on the top surface side of the cover member 422 and is exhausted by the exhaust mechanism 442 via the exhaust pipe 441.

In the process of removing the tungsten oxide film 101 (steps S2 and S12), the gas supplier 450 supplies $TiCl_4$ gas and Ar gas. Radio-frequency power is not supplied from the first radio-frequency power supply 444 and the second radio-frequency power supply 446 (no plasma is generated). The heater 421 controls the temperature of the stage 420 (the substrate) to 300 degrees C. to 600 degrees C.

On the other hand, in the process of forming the titanium film 102 (step S13), the gas supplier 450 supplies $TiCl_4$ gas, $H_2$ gas, $NH_3$ gas, and Ar gas. In addition, radio-frequency power is supplied from the first radio-frequency power supply 444 or from both the first radio-frequency power supply 444 and the second radio-frequency power supply 446 to generate plasma. The temperature of the stage 420 (the substrate) is continuously controlled between 300 degrees C. and 600 degrees C.

In the process of oxidizing the titanium film 102 (step S14), $O_2$ gas is supplied from the gas supplier 450. Plasma may or may not be generated. In addition, the temperature of the stage 420 (the substrate) is continuously controlled between 300 degrees C. and 600 degrees C.

In the process of removing the titanium oxide film 103 (step S21), the gas supplier 450 supplies $Cl_2$ gas and Ar gas. In addition, radio-frequency power is supplied from the first radio-frequency power supply 444 or from both the first radio-frequency power supply 444 and the second radio-frequency power supply 446 to generate plasma. The temperature of the stage 420 (the substrate) is controlled to 300 degrees C. to 500 degrees C.

After predetermined processing is completed, the controller 460 turns off the ON/OFF switch 448 to release the attraction of the substrate W to the stage 420, and controls the lifting mechanism 424 to move the stage 420 to the delivery position. At this time, the heads of the lifting pins 427 protrude from the placement surface of the stage 420 to raise the substrate W from the placement surface of the stage 420.

The controller 460 opens the gate valve 412. Here, the substrate W placed on the lifting pins 427 is carried out by the external transfer mechanism 21. When the transfer mechanism 21 comes out of the carry-in/out port 411, the controller 460 closes the gate valve 412.

In this way, with the processing apparatus 400 illustrated in FIG. 8, a predetermined processing to be executed in the first processing chamber can be performed. After performing the predetermined processing in the first processing chamber, the substrate W is vacuum-transferred to the second processing chamber to form a ruthenium film.

[Processing Apparatus]

Figure 9:
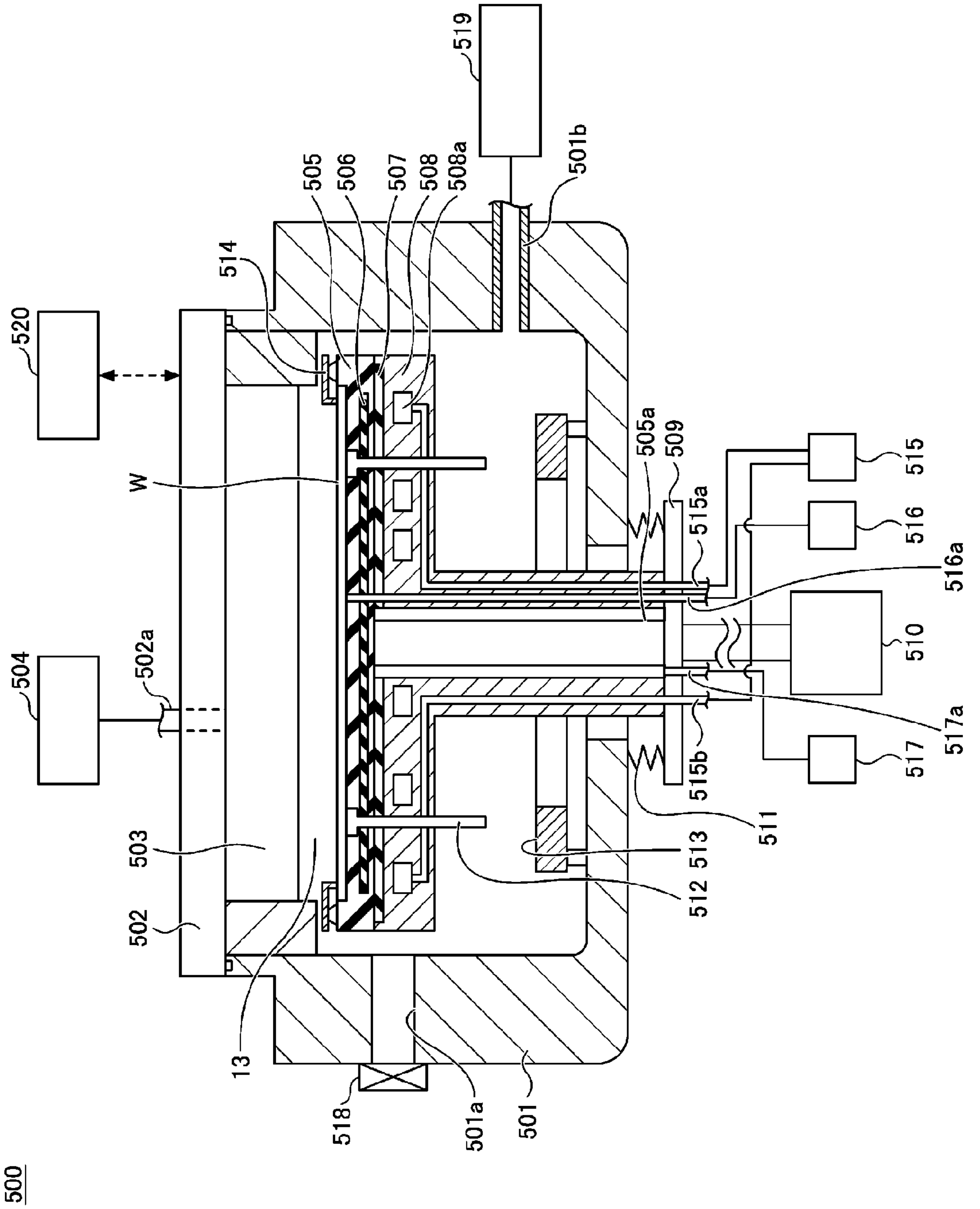
FIG. 9 is a configuration example of a processing apparatus that implements a second processing chamber according to an embodiment.

Next, a configuration example of a processing apparatus 500 that implements the second processing chamber in a film forming method of an embodiment will be described. FIG. 9 is a configuration example of a processing apparatus that implements the second processing chamber according to an embodiment.

The processing apparatus 500 illustrated in FIG. 9 is an apparatus that performs the process of forming the ruthenium film 130 (steps S4 and S17). In addition, the processing apparatus 500 is an apparatus that performs the process of removing the titanium oxide film 103 (step S16).

The processing apparatus 500 illustrated in FIG. 9 is a chemical vapor deposition (CVD) apparatus. In the processing apparatus 500, for example, a ruthenium-containing precursor is supplied, and formation of a ruthenium film on the substrate W is performed. The processing apparatus 500 used in the processing chamber 13 (see FIG. 7) will be described below as an example.

The processing apparatus 500 includes a main body container 501 and a support member 502. A main body container 501 is a bottomed container having an opening at the upper side thereof. The support member 502 supports a gas ejection mechanism 503. In addition, the support member 502 closes the upper opening of the main body container 501 to seal the main body container 501 and to form the processing chamber 13. A gas supplier 504 supplies a process gas such as a ruthenium-containing raw material gas or a carrier gas to the gas ejection mechanism 503 through a supply pipe **502*a* penetrating the support member 502. The ruthenium-containing raw material gas and the carrier gas supplied from the gas supplier 504 are supplied into the processing chamber 13 from the gas ejection mechanism 503**.

A stage (placement table) 505 is a member on which a substrate W is placed, and is illustrated as a stage **13*a* in FIG. 7. A heater 506 is provided inside the stage 505 so as to heat the substrate W. In addition, the stage 505 includes a support 505*a*, which extends downward from the center of the bottom surface of the stage 505 and is supported at one end thereof, which penetrates the bottom portion of the main body container 501, on a lifting mechanism via a lifting plate 509. In addition, the stage 505 is fixed on a temperature control jacket 508, which is a temperature control member, via a heat insulating ring 507. The temperature control jacket 508 includes a plate fixing the stage 505, a shaft extending downward from the plate and configured to cover the support 505*a***, and a hole penetrating the shaft from the plate.

The shaft of the temperature control jacket 508 penetrates the bottom portion of the main body container 501. The lower end portion of the temperature control jacket 508 is supported by the lifting mechanism 510 via the lifting plate 509 disposed below the main body container 501. A bellows 511 is provided between the bottom portion of the main body container 501 and the lifting plate 509, so that airtightness in the main body container 501 is also maintained by the vertical movement of the lifting plate 509.

When the lifting mechanism 510 raises/lowers the lifting plate 509, the stage 505 raised/lowered between a processing position (see FIG. 9) at which a substrate W is processed and a delivery position (not illustrated) at which the substrate W is delivered between the stage 505 and an external transfer mechanism 21 (see FIG. 7) through a carry-in/out port 501*a*.

Lifting pins 512 support the substrate W from the bottom surface of the substrate W and raise the substrate W from the placement surface of the stage 505 when the substrate W is delivered between the stage 505 and the external transfer mechanism 21 (see FIG. 7). The lifting pins 512 each have a shaft and a head having a diameter larger than that of the shaft. Through-holes are formed through the stage 505 and the plate of the temperature control jacket 508, and the shafts of the lifting pins 512 are inserted through the through-holes, respectively. In addition, on the placement surface side of the stage 505, recesses for accommodating the heads of the lifting pins 512 are formed. An abutment member 513 is disposed below the lifting pins 512.

In the state in which the stage 505 is moved to the processing position of the substrate W (see FIG. 9), the heads of the lifting pins 512 are accommodated in the recesses, and the substrate W is placed on the placement surface of the stage 505. In addition, the heads of the lifting pins 512 are engaged in the recesses, respectively, the shafts of the lifting pins 512 pass through the stage 505 and the plate of the temperature control jacket 508, and the lower ends of the shafts of the lifting pins 512 protrude from the plate of the temperature control jacket 508. Meanwhile, in the state in which the stage 505 is moved to the delivery position (not illustrated) of the substrate W, the lower ends of the lifting pins 512 abut on the abutment member 513 and the heads of the lifting pins 512 protrude from the placement surface of the stage 505. As a result, the heads of the lifting pins 512 support the substrate W from the bottom surface of the substrate W, and raise the substrate W from the placement surface of the stage 505.

An annular member 514 is disposed above the stage 505. In the state in which the stage 505 is moved to the processing position (see FIG. 9) of the substrate W, the annular member 514 comes into contact with the outer peripheral portion of the top surface of the substrate W and presses the substrate W against the placement surface of the stage 505 by its own weight. Meanwhile, in the state in which the stage 505 is moved to the delivery position of the substrate W (not illustrated), the annular member 514 is engaged with an engagement portion (not illustrated) above the carry-in/out port 501*a*. Thus, the delivery of the substrate W by the transfer mechanism 21 (see FIG. 7) is not hindered.

A chiller unit 515 circulates coolant (e.g., cooling water) through a flow path 508*a* formed in the plate of the temperature control jacket 508 through pipes 515*a* and 515*b*.

A heat transfer gas supplier 516 supplies a heat transfer gas (e.g., He gas) to the space between the rear surface of the substrate W placed on the stage 505 and the placement surface of the stage 505 through a pipe 516*a*.

The purge gas supplier 517 causes a purge gas to flow through a pipe 517*a*, the gap between the support 505*a* and the hole of the temperature control jacket 508, a flow path formed between the stage 505 and the heat insulating ring 507 and extending radially outward, and a vertical flow path formed in the outer peripheral portion of the stage 505. Then, through these flow paths, the purge gas, such as carbon monoxide (CO) gas, is supplied to the space between the bottom surface of the annular member 514 and the top surface of the stage 505. Thus, the process gas is prevented from flowing into the space between the bottom surface of the annular member 514 and the top surface of the stage 505, thereby preventing a film from being formed on the bottom surface of the annular member 514 or the top surface of the outer peripheral portion of the stage 505.

The side wall of the main body container 501 is provided with a carry-in/out port 501*a* for carry-in/out of a substrate W and a gate valve 518 for opening/closing the carry-in/out port 501*a*. The gate valve 518 is illustrated as the gate valve 63 in FIG. 7.

An exhauster 519 including a vacuum pump or the like is connected to the lower side wall of the main body container 501 through an exhaust pipe 501*b*. The interior of the main body container 501 is exhausted by the exhauster 519, so that the interior of the processing chamber 13 is set to and maintained at a predetermined vacuum (depressurized) atmosphere (e.g., 1.33 Pa).

The controller 520 is, for example, a computer, and includes a central processing unit (CPU), a random access memory (RAM), a read only memory (ROM), an auxiliary memory, and the like. The CPU of the controller 520 controls the gas supplier 504, the heater 506, the lifting mechanism 510, the chiller unit 515, the heat transfer gas supplier 516, the purge gas supplier 517, the gate valve 518, the exhauster 519, and the like. As a result, the controller 520 controls the operation of the processing apparatus 500. A computer-readable program necessary for control by the controller 520 may be stored in a storage medium. The storage medium includes, for example, a flexible disk, a compact disk (CD), a CD-ROM, a hard disk, a flash memory, a DVD, or the like. In addition, the controller 520 may be provided independently of the controller 70 (see FIG. 7), or the controller 70 may also serve as the controller 520.

An example of the operation of the substrate processing apparatus 500 will be described. At the start, the interior of the processing chamber 13 is in a vacuum (depressurized) atmosphere by the exhauster 519. In addition, the stage 505 is moved to the delivery position.

The controller 520 opens the gate valve 518. Here, a substrate W is placed on the lifting pins 512 by the external transfer mechanism 21. When the transfer mechanism 21 comes out of the carry-in/out port 501*a*, the controller 520 closes the gate valve 518.

The controller 520 controls the lifting mechanism 510 to move the stage 505 to the processing position. At this time, as the stage 505 is raised, the substrate W placed on the lifting pins 512 is placed on the placement surface of the stage 505. In addition, the annular member 514 comes into contact with the outer peripheral portion of the top surface of the substrate W, and presses the substrate W against the placement surface of the stage 505 by its own weight.

At the processing position, the controller 520 controls the gas supplier 504 to supply various gases in the process of forming the ruthenium film 130 (steps S4 and S17) and the process of removing the titanium oxide film 103 (step S16). In addition, the controller 520 operates the heater 506 to control the temperature of the stage 420 (the substrate) to 100 degrees C. to 300 degrees C. in the process of forming the ruthenium film 130 (steps S4 and S17). In the process of removing the titanium oxide film 103 (step S16), the temperature of the stage 420 (the substrate) is controlled to 100 degree C. to 500 degree. As a result, predetermined processing such as formation of a ruthenium film on the substrate W is performed. The gas after the processing passes through the flow path on the top surface side of the annular member 514 and is exhausted by the exhauster 519 through the exhaust pipe 501*b*.

At this time, the controller 520 controls the heat transfer gas supplier 516 to supply a heat transfer gas to the space between the rear surface of the wafer W placed on the stage 505 and the placement surface of the stage 505. In addition, the controller 520 controls the purge gas supplier 517 to supply a purge gas to the space between the bottom surface of the annular member 514 and the top surface of the stage 505. The purge gas passes through the flow path on the bottom surface side of the annular member 514 and is exhausted by the exhauster 519 through the exhaust pipe 501*b*.

When the predetermined processing is completed, the controller 520 controls the lifting mechanism 510 to move the stage 505 to the delivery position. At this time, by lowering the stage 505, the annular member 514 is engaged with an engagement portion (not illustrated). In addition, when the lower ends of the lifting pins 512 abut on the abutment member 513, the heads of the lifting pins 512 protrude from the placement surface of the stage 505 and raise the substrate W from the placement surface of the stage 505.

The controller 520 opens the gate valve 518. Here, the substrate W placed on the lifting pins 512 is carried out by the external transfer mechanism 21. When the transfer mechanism 21 comes out of the carry-in/out port 501*a*, the controller 520 closes the gate valve 518.

As described above, with the processing apparatus 500 illustrated in FIG. 9, it is possible to perform predetermined processing, such as formation of a ruthenium (Ru) film, on a substrate W. The processing apparatus 400 including the processing chamber 11 and the processing apparatus 500 including the processing chamber 13 have been described. However, the processing apparatus including the processing chamber 12 and the processing apparatus including the processing chamber 14 may also have the same configuration as or different from any of the processing apparatuses described above. These are applicable as appropriate from the viewpoint of operating rate and productivity.

The film forming methods and the substrate processing systems according to the embodiments disclosed herein should be considered as being exemplary in all respects and not restrictive. The embodiments may be modified and improved in various forms without departing from the scope and spirit of the appended claims. The matters described in the plurality of embodiments described above may take other configurations within the non-contradictory range and may be combined within the non-contradictory range. For example, it is also possible to perform the process of removing a titanium oxide film in the second processing chamber immediately after the process of forming a titanium film.

The processing apparatuses of the present disclosure are applicable to any of an atomic layer deposition (ALD) type apparatus, a capacitively coupled plasma (CCP) type apparatus, an inductively coupled plasma (ICP) type apparatus, a radial line slot antenna (RLSA) type apparatus, an electron cyclotron resonance plasma (ECR) type apparatus, and a helicon wave plasma (HWP) type apparatus.

According to an aspect, a tungsten oxide film can be effectively removed before embedding a ruthenium film in a recess.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:

preparing, on a stage, a substrate having an insulating layer, in which a recess defined by an upper portion, a side wall portion, and a bottom portion is formed, and a tungsten layer exposed from the bottom portion of the recess;

removing a tungsten oxide film, which has been formed by oxidizing the tungsten layer at the bottom portion, by supplying $TiCl_4$ gas to at least the bottom portion of the recess;

forming a titanium film after the removing the tungsten oxide film such that the tungsten layer exposed from the bottom portion is suppressed from being oxidized by the titanium film; and embedding a ruthenium film in the recess after the forming the titanium film.

2. The film forming method of claim 1, wherein the titanium film absorbs oxygen contained in the tungsten oxide film remaining under the titanium film.

3. The film forming method of claim 2, further comprising:

removing a titanium oxide film at the bottom portion of the recess by supplying $Cl_2$ gas to at least the bottom portion of the recess in a first processing chamber, after the forming the titanium film, wherein, after the removing the titanium oxide film at the bottom portion, the removing of the tungsten oxide film from the bottom portion is repeatedly executed.

4. The film forming method of claim 3, further comprising:

vacuum-transferring the substrate from the first processing chamber to a second processing chamber, after the removing the tungsten oxide film and the forming the titanium film in the first processing chamber are repeatedly executed a set number of times.

5. The film forming method of claim 4, further comprising:

removing the titanium oxide film by supplying $Cl_2$ gas to at least the bottom portion of the recess in the second processing chamber, after the forming the titanium film or after modifying the titanium film into the titanium oxide film, wherein the ruthenium film is embedded in the recess after the removing of the titanium oxide film.

6. The film forming method of claim 1, further comprising:

vacuum-transferring the substrate from a first processing chamber to a second processing chamber configured to embed a ruthenium film, after the forming the titanium film.

7. The film forming method of claim 6, further comprising:

modifying the titanium film into a titanium oxide film by supplying $O_2$ gas to at least the bottom portion of the recess in the first processing chamber, after the forming the titanium film.

8. The film forming method of claim 1, wherein the insulating layer is any of a silicon oxide film, a silicon nitride film, and a layer formed by forming a silicon oxide film on a silicon nitride film.

9. A film forming method of embedding a ruthenium film in a recess, the film forming method comprising:

preparing, on a stage, a substrate having an insulating layer, in which the recess defined by an upper portion, a side wall portion, and a bottom portion is formed, and a tungsten layer exposed from the bottom portion of the recess; and forming a titanium film on the exposed tungsten layer before embedding a ruthenium in the recess, wherein the tungsten layer exposed from the bottom portion is suppressed from being oxidized by the titanium film.

10. The film forming method of claim 9, wherein the titanium film absorbs oxygen contained in a tungsten oxide film remaining under the titanium film.

11. The film forming method of claim 10, further comprising:

removing a titanium oxide film at the bottom portion of the recess by supplying $Cl_2$ gas to at least the bottom portion of the recess in a first processing chamber, after the forming the titanium film, wherein, after the removing the titanium oxide film at the bottom portion, the removing of the tungsten oxide film from the bottom portion is repeatedly executed.

12. The film forming method of claim 11, further comprising:

vacuum-transferring the substrate from the first processing chamber to a second processing chamber, after the removing the tungsten oxide film and the forming the titanium film in the first processing chamber are repeatedly executed a set number of times.

13. The film forming method of claim 12, further comprising:

removing the titanium oxide film by supplying $Cl_2$ gas to at least the bottom portion of the recess in the second processing chamber, after the forming the titanium film or after modifying the titanium film into the titanium oxide film, wherein the ruthenium film is embedded in the recess after the removing of the titanium oxide film.

14. The film forming method of claim 9, further comprising:

vacuum-transferring the substrate from a first processing chamber to a second processing chamber configured to embed a ruthenium film, after the forming the titanium film.

15. The film forming method of claim 14, further comprising:

modifying the titanium film into a titanium oxide film by supplying $O_2$ gas to at least the bottom portion of the recess in the first processing chamber, after the forming the titanium film.

16. A substrate processing system comprising:

a plurality of processing chambers including a first processing chamber and a second processing chamber;

a vacuum transfer chamber configured to vacuum-transfer a substrate between the plurality of processing chambers; and a controller, wherein the controller is configured to control a process comprising:

preparing, on a stage of the first processing chamber, a substrate having an insulating layer, in which a recess defined by an upper portion, a side wall portion, and a bottom portion is formed, and a tungsten layer exposed from the bottom portion of the recess;

removing a tungsten oxide film, which has been formed by oxidizing the tungsten layer at the bottom portion, by supplying $TiCl_4$ gas to at least the bottom portion of the recess;

forming a titanium film after the removing the tungsten oxide film, such that the tungsten layer exposed from the bottom portion is suppressed from being oxidized by the titanium film;

vacuum-transferring the substrate from the first processing chamber to the second processing chamber, after the forming the titanium film; and embedding a ruthenium film in the recess in the second processing chamber.

* * * * *